United States Patent
Leung et al.

(10) Patent No.: US 6,768,120 B2
(45) Date of Patent: Jul. 27, 2004

(54) FOCUSED ELECTRON AND ION BEAM SYSTEMS

(75) Inventors: Ka-Ngo Leung, Hercules, CA (US); Jani Reijonen, Oakland, CA (US); Arun Persaud, Berkeley, CA (US); Qing Ji, Berkeley, CA (US); Ximan Jiang, El Cerrito, CA (US)

(73) Assignee: The Regents of the University of California, Oakland, CA (US)

( * ) Notice: Subject to any disclaimer, the term of this patent is extended or adjusted under 35 U.S.C. 154(b) by 59 days.

(21) Appl. No.: 10/232,502

(22) Filed: Aug. 30, 2002

(65) Prior Publication Data

US 2004/0036032 A1 Feb. 26, 2004

Related U.S. Application Data

(60) Provisional application No. 60/316,789, filed on Aug. 31, 2001, and provisional application No. 60/375,101, filed on Apr. 22, 2002.

(51) Int. Cl.[7] ............................ H01J 27/00; H01J 27/02
(52) U.S. Cl. ................... 250/423 R; 250/424; 250/427; 315/111.81; 315/111.91
(58) Field of Search ............................ 250/423 R, 424, 250/427; 315/111.81, 111.91

(56) References Cited

U.S. PATENT DOCUMENTS

| | | | | |
|---|---|---|---|---|
| 4,447,732 A | * | 5/1984 | Leung et al. | 315/111.81 |
| 4,793,961 A | * | 12/1988 | Ehlers et al. | 376/127 |
| 5,198,677 A | * | 3/1993 | Leung et al. | 250/424 |
| 6,094,012 A | * | 7/2000 | Leung et al. | 315/111.81 |
| 6,294,862 B1 | * | 9/2001 | Brailove et al. | 313/363.1 |
| 6,364,995 B1 | * | 4/2002 | Fairbairn et al. | 118/723 I |

* cited by examiner

Primary Examiner—John R. Lee
Assistant Examiner—Paul M. Gurzo
(74) Attorney, Agent, or Firm—Henry P. Sartorio; Joseph R. Milner

(57) ABSTRACT

An electron beam system is based on a plasma generator in a plasma ion source with an accelerator column. The electrons are extracted from a plasma cathode in a plasma ion source, e.g. a multicusp plasma ion source. The beam can be scanned in both the x and y directions, and the system can be operated with multiple beamlets. A compact focused ion or electron beam system has a plasma ion source and an all-electrostatic beam acceleration and focusing column. The ion source is a small chamber with the plasma produced by radio-frequency (RF) induction discharge. The RF antenna is wound outside the chamber and connected to an RF supply. Ions or electrons can be extracted from the source. A multi-beam system has several sources of different species and an electron beam source.

14 Claims, 5 Drawing Sheets

FOCUSED ELECTRON AND ION BEAM SYSTEMS

RELATED APPLICATIONS

This application claims priority of Provisional Applications Ser. Nos. 60/316,789 filed Aug. 31, 2001 and 60/375,101 filed Apr. 22, 2002.

GOVERNMENT RIGHTS

The United States Government has rights in this invention pursuant to Contract No. DE-AC03-76SF00098 between the United States Department of Energy and the University of California.

BACKGROUND OF THE INVENTION

The invention relates generally to electron and ion beam systems and more particularly to electron and ion beam systems based on plasma ion sources.

Conventional focused electron beam systems (such as the electron microscope) are large in size. They operate with thermionic cathodes and are normally designed for single beam operation with fixed beam spot size and energy. The lifetime and throughput current are limited by the cathode capability.

Accordingly it would be desirable to have a focused electron beam system which has a very compact size, a long lifetime, a small but variable spot size, a high current density, and a beam energy of a few to tens of kV.

A new type of instrument, a Dual Beam FIB (Focused Ion and Electron Beam) system has been developed recently which uses a focused $Ga^-$ ion beam for high-rate sputtering of material and a scanning electron beam for imaging. The tool can be used in surface treatment for high-resolution imaging in nanomaterial characterization, in TEM sample preparation, and for failure analysis in the semiconductor industry. This system is bulky and uses a liquid metal ion source which leaves a lot of unwanted residues on the target sample.

Accordingly, it would be desirable to have a system which avoids the use of a liquid metal source of $Ga^-$ ions.

It also would be desirable to have a system that has an accelerator column which is very compact, thus making it moveable and exchangeable.

It further would be desirable to have a system in which the same gun can be used to generate focused electron beams as well as molecular and negative ion beams in addition to positive ion beams.

SUMMARY OF THE INVENTION

The electron beam system of the invention is very compact and has a long lifetime. The system is based on a plasma generator in a plasma ion source with an accelerator column. The electrons are extracted from a plasma cathode in a plasma ion source. An accelerator column following the plasma ion source has a length down to about 1 cm. The total length of the system can be less than 10 cm. The beam spot size is less than 60 nm and can be varied, and the current density can be higher than $7 \times 10^4$ A $cm^2$. The accelerator column can be designed to produce focused electron beams with energy ranging from a few to tens of kV. The beam can be scanned in both the x and y directions, and the system can be operated with multiple beamlets.

The invention also includes a new type of ion gun. The new focused ion beam system consists of a plasma ion source and an all-electrostatic beam acceleration and focusing column. The ion source is preferably a small (about 1.5 cm diameter) quartz chamber (although it can be larger in size) with the plasma produced by radio-frequency (RF) induction discharge. The RF antenna is preferably a water-cooled copper coil which is wound outside the quartz chamber and connected to an RF supply. There is no weak component in this arrangement and therefore the plasma source should have a very long lifetime. Ions or electrons can be extracted from the ion source.

This type of source can be used to produce positive ion beams with nearly all the elements in the periodic table. This gun can be operated with a wide range of energy and beam spot size to facilitate surface modification purposes. The same gun can be used to produce focused cluster or negative ion beams so as to achieve very low impact energy, to minimize substrate charging problems and to reduce high-voltage holding issues in the accelerator column. It further can be used to produce electron beams. The invention also includes a multi-beam system having several sources of different species and an electron beam source.

DETAILED DESCRIPTION OF THE INVENTION

Figure 1:
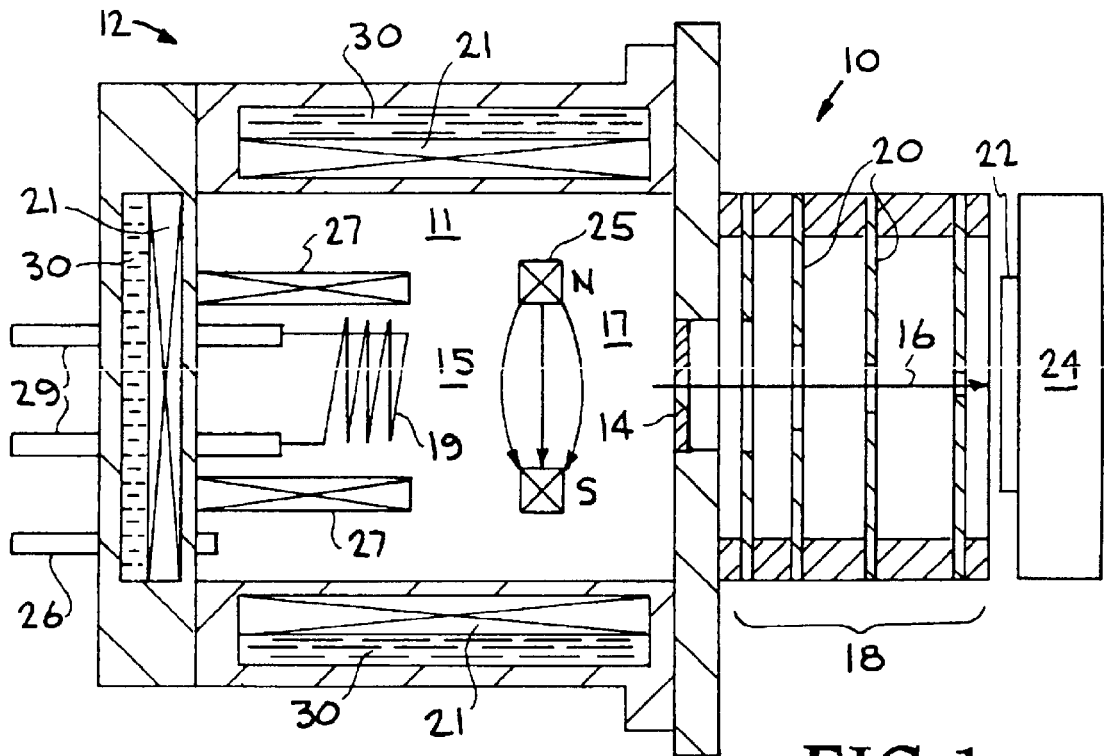
FIG. 1 is a side cross-sectional view of a focused electron beam system of the invention based on a multicusp ion source.

A focused electron beam system 10, shown in FIG. 1, utilizes a plasma cathode in a plasma ion source and an all-electrostatic accelerator column. System 10 has an ion source 12 from which electrons are extracted through extractor 14 at one end thereof. The extracted electron beam 16 passes through an acceleration and reduction column 18, of length L, formed of a plurality of electrode lenses 20. Column 18 reduces the electron beam 16 to a desired spot size and accelerates the beam to a desired energy. The beam from column 18 is incident on a wafer 22 which is mounted on a mechanical (XY) stage or support 24. The wafer 22 may be coated with a resist layer which is exposed and processed by conventional techniques.

As shown in FIG. 1, ion source 12 has an inner chamber 11 which has a plasma generation region 15 and extraction region 17. A plasma made up of ions and electrons is produced in plasma generation region 15 of ion source 12 which may be of conventional design. Plasma is generated by an RF antenna 19 or alternatively by a filament. A linear magnetic filter 25 or a coaxial magnetic filter 27 is used to decrease energy spread of the ions and electrons, i.e. to obtain a low electron temperature (about 0.1 eV) in front of the exit aperture. The plasma ions and electrons pass to extraction region 17 of source 12. Conventional multicusp ion sources are illustrated by U.S. Pat. Nos. 4,793,961; 4,447,732; 5,198,677; 6,094,012, which are herein incorporated by reference.

The multicusp plasma generator can provide positive or negative ions of virtually any species, or electrons. The external surface of ion source 12 is surrounded by columns of permanent magnets 21 which form multicusp fields for primary ionizing electron and plasma confinement. The cusp fields are localized near the source wall, leaving a large portion of the source free of magnetic fields. As a result, this type of ion source can generate large volumes of uniform and quiescent plasmas having relatively flat radial density profiles. For example, a 30 cm diameter chamber can be used to form a uniform plasma volume of about 18 cm diameter. Larger uniform plasmas can be generated by using bigger source chambers with well designed permanent magnet configurations.

The plasma of the multicusp source can be produced by either radio-frequency (RF) induction discharge or by dc filament discharge into a gas input into chamber 11 through gas inlet 26. However, an RF driven discharge is generally preferred since the quartz antenna coil typically used for antenna 19 will not generate impurities and there is no radiation heating of the first electrode of column 18 due to hot tungsten filament cathodes. Antenna (or filament) 19 is connected to an external power supply (not shown) through feedthroughs 29. The discharge plasma will be formed in short pulses, e.g. about 300 ms pulse length, with high or low repetition rates. Waterjackets 30 may be provided in ion source 12 for cooling.

The open end of ion source 12 is closed by extractor 14 which is formed of one or more extraction electrodes which contain central apertures through which the electron beam can pass. Typically there are two spaced electrodes, a first beam forming electrode and a second beam extracting electrode, for electrostatically controlling the passage of an electron (or ion) beam from the ion source. An electron beam is extracted by applying a voltage of the correct (positive) polarity to extractor 14. (A positive ion beam can be extracted by applying a negative extraction voltage.)

To extract an electron beam, an argon plasma can be used. Any other species which produces positive ions and electrons may also be used. An extractable electron current density higher than 1 A/cm$^2$ can be obtained.

Figure 2:
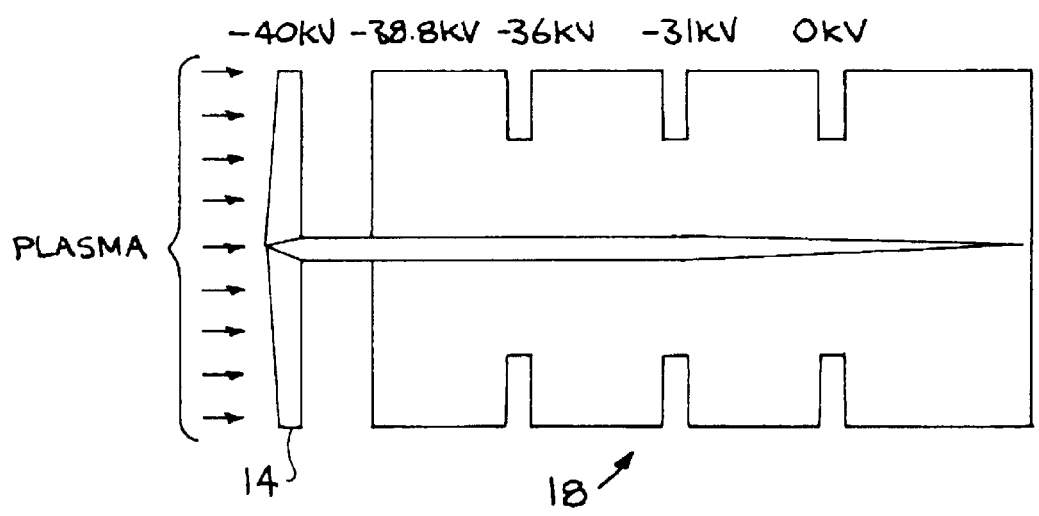
FIGS. 2, 3 illustrate two compact acceleration and focusing columns of the invention.
Figure 3:
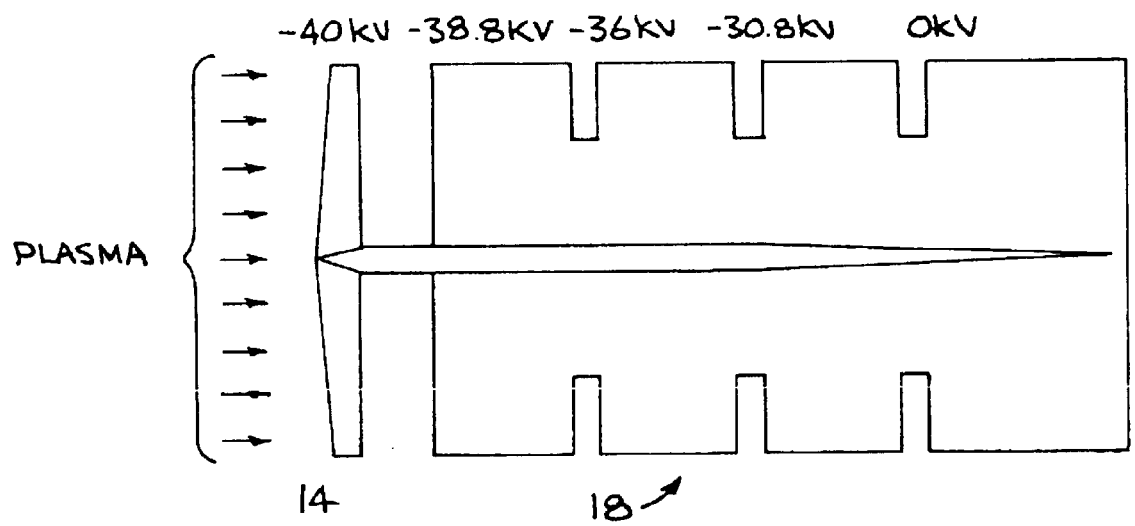
Figure 4:
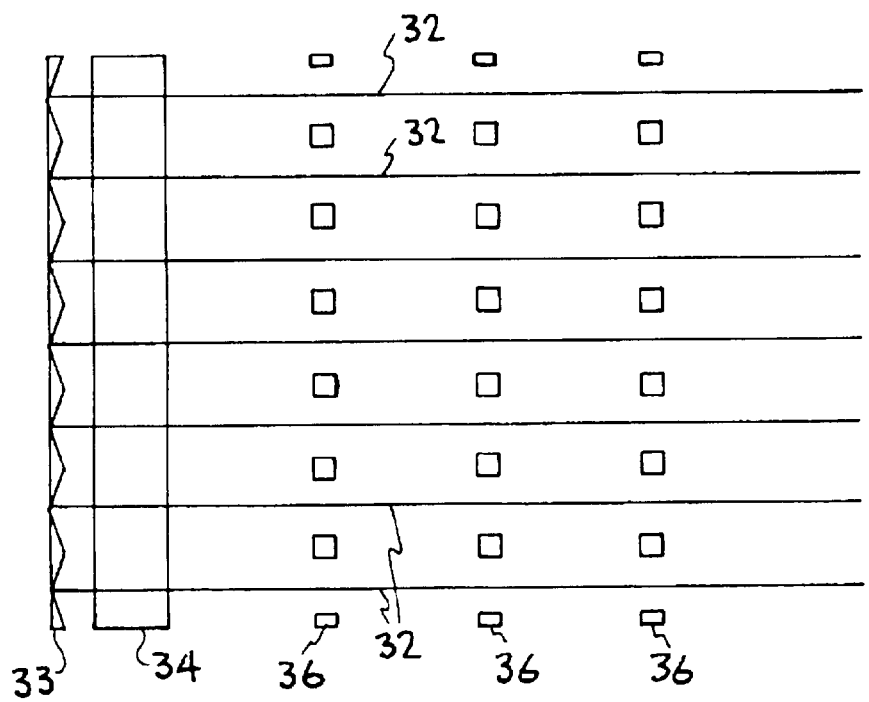
FIG. 4 shows a multi-beamlet extraction and acceleration and focusing column of the invention.

The extracted electron beam may first be collimated in a collimator structure in the column 18 (see FIG. 4). The collimator structure will eliminate beams with large divergent angles. As the electron beam emerges from the collimator, it will be accelerated to a higher energy by the following series of electrodes 20. FIGS. 2, 3 show some illustrative dimensions and voltages for the focusing and accelerator column 18.

FIG. 2 illustrates an example in which the focused electron beam has a final beam spot size of about 60 nm with energy about 40 keV and focused current density of about $7 \times 10^4$ A/cm$^2$. The beam spot size can be enlarged to about 500 nm by simply adjusting the voltages on the accelerator electrodes as shown in FIG. 3. The entire system is very compact, having a total length of down to less than 10 cm, with the accelerator column having a length of only about 1 cm.

If necessary, multiple beamlets 32 can be extracted from the plasma cathode and they can be accelerated and focused to small beam spots as shown in FIG. 4. Beamlets 32 are extracted through an extractor 33 having a plurality of apertures therein, pass through a collimator 34 (optional), and are accelerated and focused by passing through a series of electrodes 36 with a similar plurality of aligned apertures.

Figure 5:
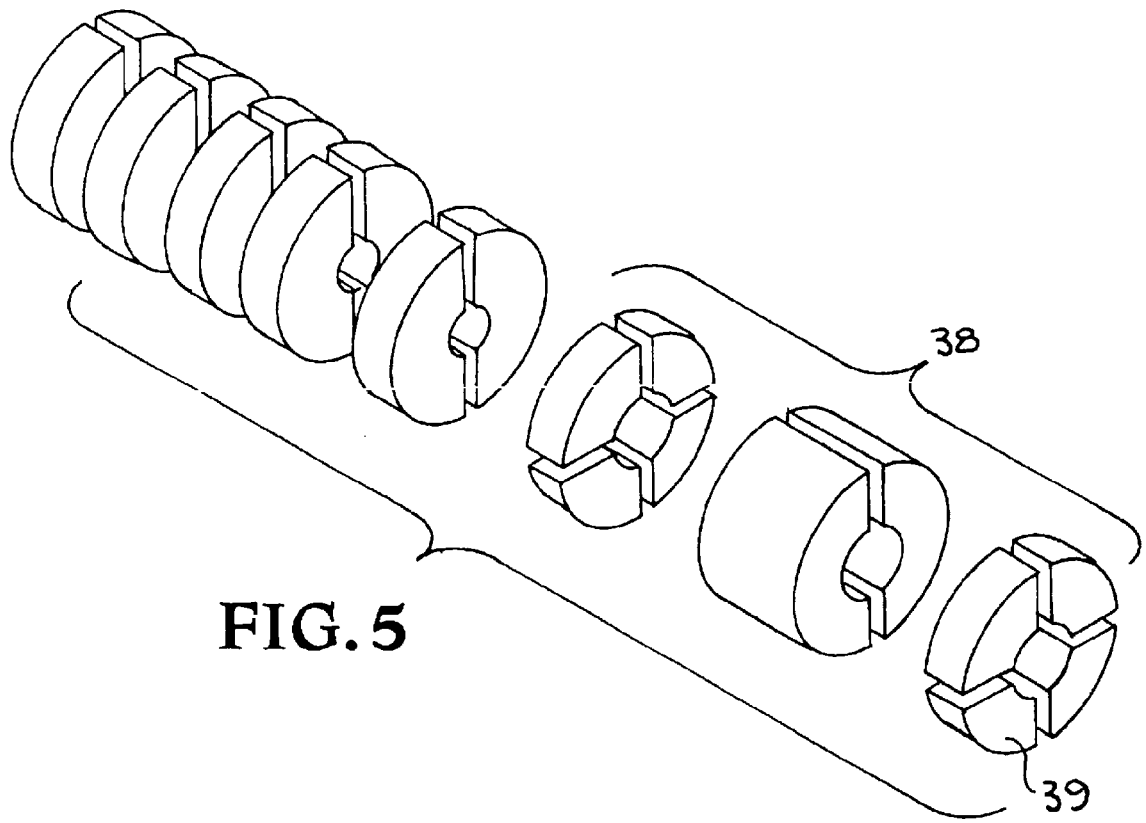
FIG. 5 is a perspective view of a split electrode system for electron beam scanning.

For beam scanning purposes, the last electrode in column 18 can be an Einzel lens 38, shown in FIG. 5, which is formed with at least one split electrode 39. By splitting the electrode 39 into quadrants and applying proper voltages on the split electrode quadrants, the electron beam passing through the central aperture therein can be steered in either the x or y direction.

The electron beam source of the invention can be used for electron microscopes, circuit inspection, lithographic mask inspection, and storage applications.

Figure 6:
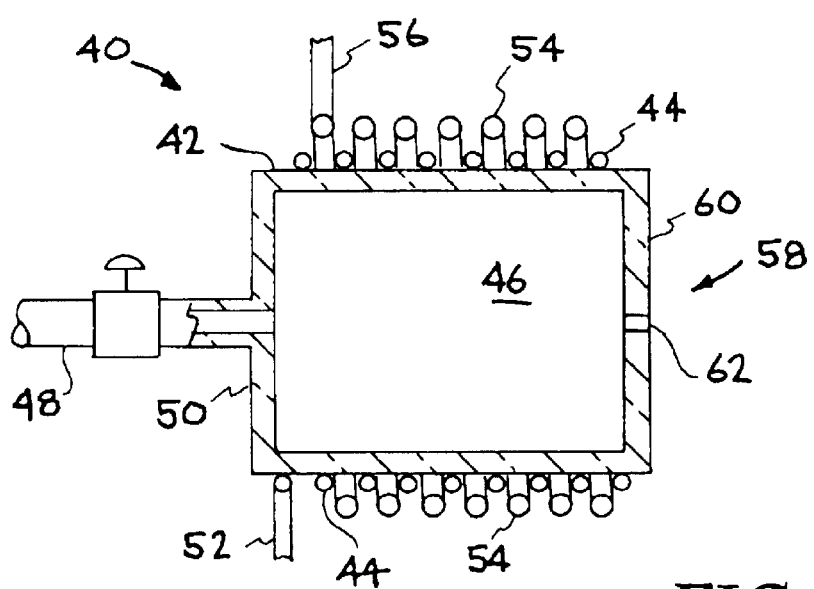
FIG. 6 is a side cross-sectional view of a miniaturized plasma ion source of the invention.

FIG. 6 shows an RF plasma generator or source 40 of the invention. Plasma ion source 40 is formed of a quartz (or other material) plasma chamber 42. Chamber 42 is typically compact or miniaturized, with an outer diameter of about 2 cm and a length of about 2.5 cm, but may be larger in size.

The general principles of plasma ion sources are well known in the art. Ion source 40 includes an RF antenna (induction coil) 44 surrounding (outside) plasma chamber 42 for producing an ion plasma 46 from a gas, e.g. argon, which is introduced into chamber 42 through an inlet 48 at an inlet end 50 of chamber 42. Antenna 44 is connected to an external matching network and RF power source (not shown) through conductors 52.

As an example, a 13.5 MHz RF generator is employed. Antenna 44 is typically a copper coil, preferably a water cooled copper coil, wound around the outside of chamber 42. On top of the RF antenna (coils) 44 is another coil 54, typically copper, which is connected to a DC power supply (not shown) through conductors 56. DC current passing through this outer coil 54 will produce a solenoid B-field for plasma confinement within chamber 42. The presence of the B-field can lower the operational pressure within chamber 42 substantially.

Ion source 40 also includes extraction system 58 at its outlet end 60. Extraction system 58 has a small central aperture 62, e.g. 1 mm diameter, and electrostatically controls the passage of ions from the plasma 46 out of plasma chamber 42 through aperture 62.

Figure 7:
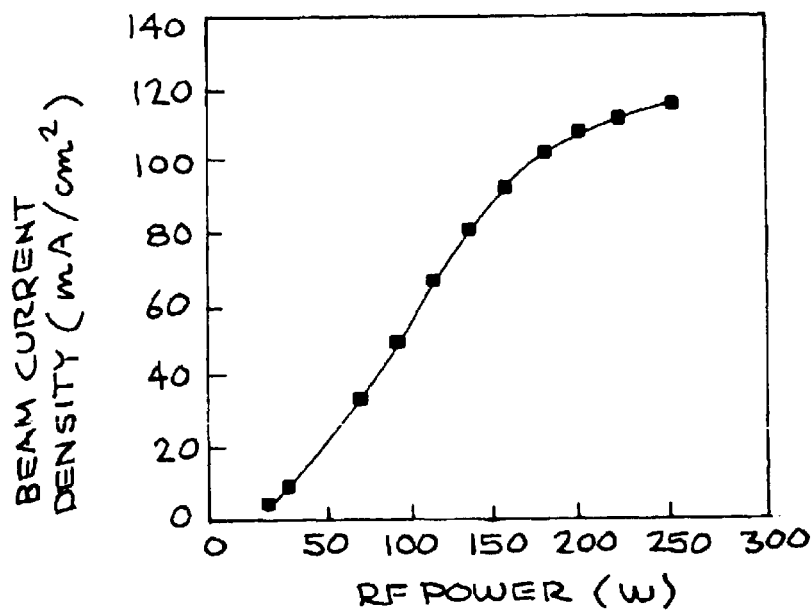
FIG. 7 is a graph of dependence of extracted 6 keV $Ar^+$ ion beam current density on RF power.
Figure 11:
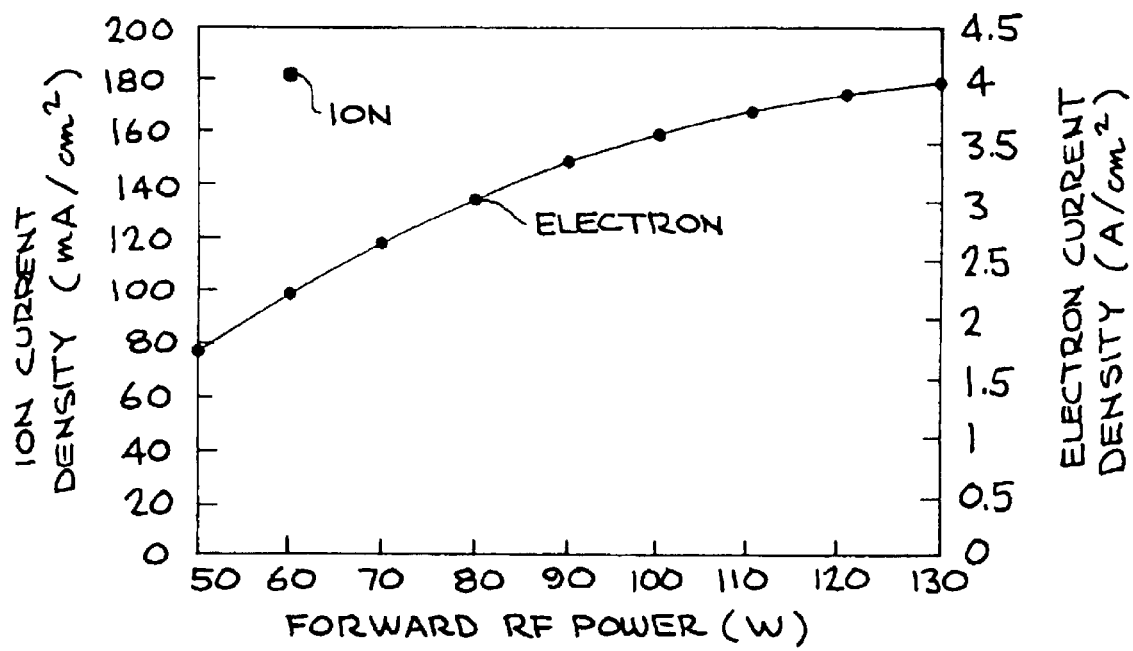
FIG. 11 is a graph of dependence of extracted 7 keV $Ar^-$ ion beam current density on RF power with a data point for extracted electron current density.

FIG. 7 is a plot of the extractable 6 keV Ar$^-$ ion current versus RF input power. It can be seen that current density over 120 mA cm$^2$ can be obtained with a modest RF power of about 250 watts. FIG. 11 similarly is a plot of the extractable 7 keV Ar$^+$ ion current versus forward RF power for a different source, with a current density of about 120 mA cm$^2$ at 70 watts. Although positive argon ions are illustrated, the source can also be used to produce other positive ions, negative ions, or electrons as described further below.

Figure 8:
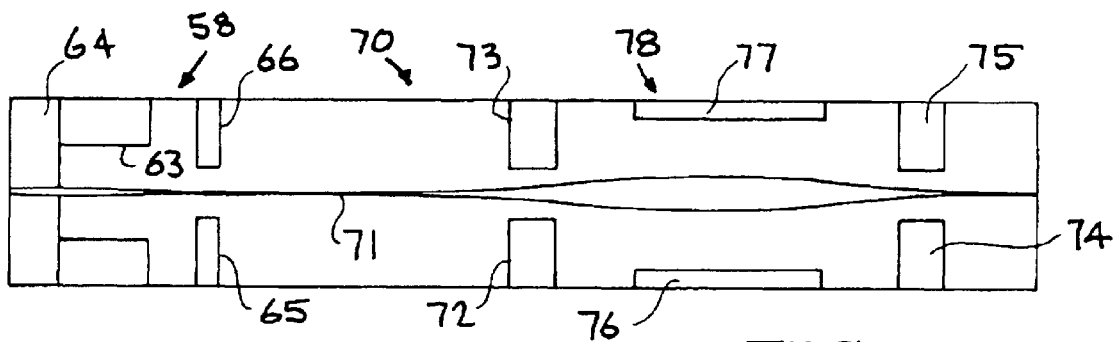
FIG. 8 is a side cross-sectional view of the extraction system of the plasma ion source with a compact acceleration and focusing column of the invention.

Following the plasma source 40 shown in FIG. 6 is an all-electrostatic acceleration and focusing column 70 shown in FIG. 8. FIG. 8 also shows details of the extraction system 58 of FIG. 6, which may be considered a part of column 70. In operation, positive ions, e.g. Ar$^-$, are extracted from source 40 through aperture 62. The ion beam formed will be accelerated and focused by column 70.

Extraction system 58 of plasma source 40 includes a first or plasma electrode 64 with a counterbore 63 and a second or extraction electrode 66, as shown in FIG. 8. The voltage on second electrode 66 may determine the beam energy. The extracted beam 71 which passes through the central aperture 65 (corresponding to aperture 62 of FIG. 6) then travels through the central apertures 72, 76, 74 in a series of electrodes 73, 77, 75 respectively. The number of electrodes may vary depending on the beam diameter, acceleration voltage, and focusing requirements. The final stage of column 70 is preferably an Einzel lens system 78 formed of the three electrodes 73, 77, 75, which focuses the beam to a small spot on the target substrate (and also steers the beam).

This accelerator/focusing system is designed by using the I-GUN and the MUNRO simulation codes. FIG. 8 specifically shows a 3 keV focused ion beam column design. In this example, the beam spot size is reduced by about a factor of 10. The beam brightness should exceed 1000 A cm$^2$-Sr. High beam brightness is needed in order to facilitate high speed surface processing. By using this type of electrostatic acceleration and Einzel lens focusing system, one can vary the beam energy and the beam spot size independently.

Figure 9:
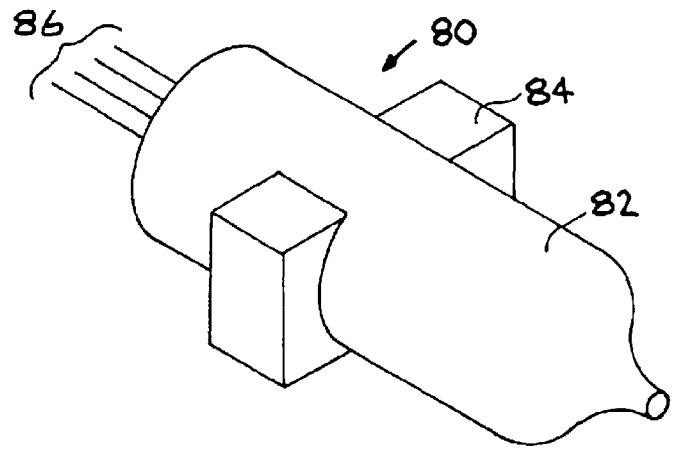
FIG. 9 is a perspective view of a simple tool with a housing containing an RF ion source and an acceleration and focusing column of the invention.

An FIB system 80 includes the RF ion source 40 and the accelerator/focusing column 70 of FIGS. 6, 8 housed inside a grounded container or housing 82 as illustrated in FIG. 9. The grounded metal housing 82 will eliminate any unwanted electric field to be present inside the FIB system 80. Housing 82 is held on a mounting fixture 84. Electrical cables 86 extend out of housing 82.

Figure 10:
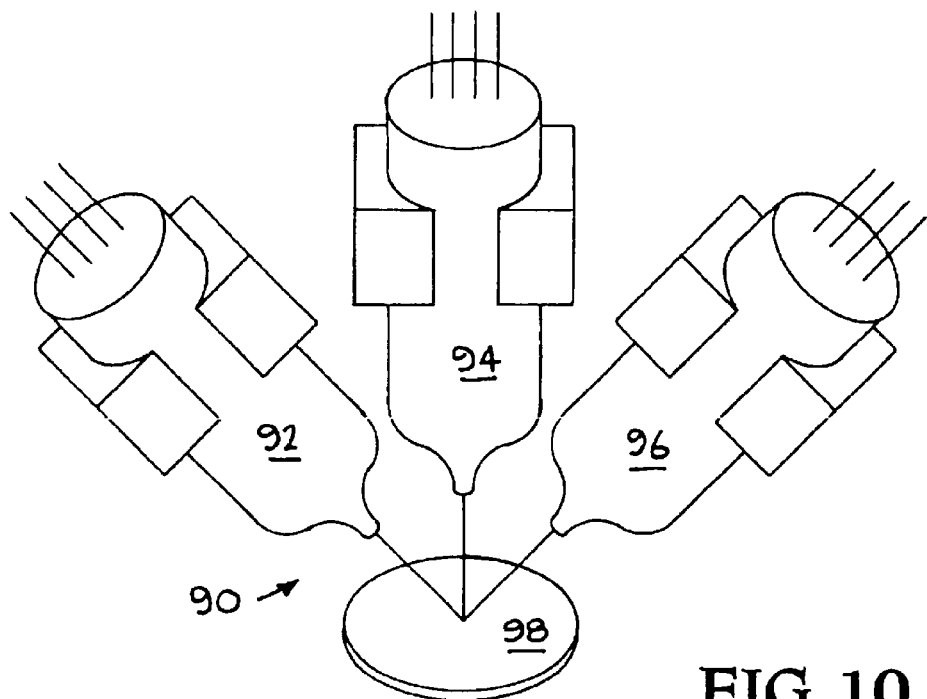
FIG. 10 is a perspective view of a three-beam system of the invention.

The ion gun of the invention can be operated in tandem with a focused electron beam gun to form a Dual Beam FIB System. In this system, the electron beam is used to image the spot where the ion beam is focused. The compact RF-driven plasma source can be used to generate focused ion beams of various elements. FIG. 10 shows a very compact three-beam system 90. In this arrangement, the positions of individual guns 92, 94, 96 are individually adjustable while the substrate 98 is stationary.

Besides forming focused atomic positive ion beams, the same FIB system can be used to produce focused molecular ion beams. In particular, one can make cluster ion beams such as C60. When these ions collide with the substrate surface, they will break up into smaller atoms or molecules. The energy of the parent cluster ion will be shared among all these sub-particles. If the number of particles is large, the impact energy of individual particle can be very small (several eV). Low impact energy is needed in some applications. It is not easy to generate a very low energy ion beam with reasonable current density. Acceleration of cluster ions can provide large number of particles with low impact energy.

In addition to cluster ions, one can use the same instrument to form a negative ion FIB system, by changing the extraction polarity and using gases which produce negative ions. If the substrate is not an electrically conducting material, it can be charged to high voltages by the incoming positive ions. This can cause voltage breakdown on the substrate surface. If a high positive voltage builds up on the substrate, the incoming positive ions will be deflected and they can cause damage when they impact on other surface areas. Negative ions have a high secondary electron emission coefficient and therefore the charging voltage will be low (several volts). Voltage holding can also be much improved in the negative ion beam system because the secondary electrons generated cannot accelerate back towards the ion source.

The RF plasma source can be used to produce high brightness focused electron beams as well as focused ion beams. Electrons can be extracted by producing a plasma such as argon which contains no negative ions, and extracting the electrons using the opposite voltage polarity on the extraction electrode from that used to extract Ar ions.

Changes and modifications in the specifically described embodiments can be carried out without departing from the scope of the invention which is intended to be limited only by the scope of the appended claims.

What is claimed is:

1. A ion and electron source, comprising:
    a compact chamber;
    an RF antenna wound around the outside of the chamber for producing a plasma inside the chamber,
    a DC current carrying coil wound outside the chamber over the RF antenna for providing a solenoid B-field for plasma confinement within the chamber;
    a compact acceleration and focusing column for accelerating a beam of ions or electrons extracted from the plasma inside the chamber.

2. The source of claim 1 wherein the chamber is formed of quartz.

3. The source of claim 1 wherein the chamber has an outer diameter down to about 2 cm and a length down to about 2.5 cm.

4. The source of claim 1 wherein the chamber contains argon.

5. The source of claim 1 wherein the acceleration and focusing column comprises a plurality of spaced electrostatic electrodes.

6. The source of claim 1 wherein the acceleration and focusing column includes an Einzel lens for steering the electron beam.

7. The source of claim 1 further comprising a grounded housing containing the chamber, RF antenna, and acceleration and focusing column.

8. The source of claim 1 further comprising a plurality of permanent magnets surrounding the chamber to form a multicusp magnetic field in the chamber.

9. The source of claim 1 wherein the plasma in the chamber is a source of positive ions and electrons.

10. The source of claim 9 further comprising an extraction system at one end of the chamber to which a positive polarity is applied to extract the electrons.

11. The source of claim 10 further comprising a collimator between the extraction system and the acceleration and focusing column.

12. The source of claim 1 wherein the acceleration and focusing column has a length of about 1 cm.

13. Apparatus comprising a plurality of sources, each source producing a different ion, one source producing an electron beam, wherein each source comprises:
    a compact chamber:
    an RF antenna wound around the outside of the chamber for producing a plasma inside the chamber;
    a compact acceleration and focusing column for accelerating a beam of ions or electrons extracted from the plasma inside the chamber.

14. The apparatus of claim 13 wherein each of the plurality of sources is individually adjustable in position around a stationary substrate.

* * * * *